United States Patent
Xue

(10) Patent No.: US 10,873,044 B2
(45) Date of Patent: Dec. 22, 2020

(54) METHOD AND APPARATUS FOR LIGHT ABSORPTION AND CHARGED CARRIER TRANSPORT

(71) Applicant: University of Florida Research Foundation, Inc., Gainesville, FL (US)

(72) Inventor: Jiangeng Xue, Gainesville, FL (US)

(73) Assignee: University of Florida Research Foundation Inc., Gainesville, FL (US)

( * ) Notice: Subject to any disclaimer, the term of this patent is extended or adjusted under 35 U.S.C. 154(b) by 0 days.

(21) Appl. No.: 16/122,511

(22) Filed: Sep. 5, 2018

(65) Prior Publication Data
US 2019/0019967 A1    Jan. 17, 2019

Related U.S. Application Data

(62) Division of application No. 12/601,371, filed as application No. PCT/US2008/064750 on May 23, 2008, now Pat. No. 10,096,789.

(Continued)

(51) Int. Cl.
| | | |
|---|---|---|
| *H01L 51/42* | (2006.01) | |
| *H01L 51/00* | (2006.01) | |
| *G03F 7/00* | (2006.01) | |

(52) U.S. Cl.
CPC ...... *H01L 51/4213* (2013.01); *H01L 51/0004* (2013.01); *H01L 51/424* (2013.01);
(Continued)

(58) Field of Classification Search
CPC ........... H01L 31/0384; H01L 31/03845; H01L 51/0036; H01L 51/0037; H01L 51/426;
(Continued)

(56) References Cited

U.S. PATENT DOCUMENTS

| 5,720,827 A | * | 2/1998 | Simmons ........ H01L 31/022466 |
| | | | 136/249 |
| 6,194,303 B1 | | 2/2001 | Alphenaar et al. |

(Continued)

FOREIGN PATENT DOCUMENTS

WO    WO-2006110919 A2 *    10/2006    ......... H01L 31/0284

OTHER PUBLICATIONS

Yang et al, Enhanced photovoltaic response of organic solar cell by singlet-to triplet exciton conversion, Mar. 2007, Appl. Phys. Lett. 90, 133509, 1-3. (Year: 2007).*

(Continued)

*Primary Examiner* — Andrew J Golden
(74) *Attorney, Agent, or Firm* — Thomas Horstemeyer, LLP

(57) ABSTRACT

Embodiments of the invention pertain to the use of alloyed semiconductor nanocrystals for use in solar cells. The use of alloyed semiconductor nanocrystals offers materials that have a flexible stoichiometry. The alloyed semiconductor may be a ternary semiconductor alloy, such as $A_xB_{1-x}C$ or $AB_{1-y}C_y$, or a quaternary semiconductor alloy, such as $A_xB_yC_{1-x-y}D$, $A_xB_{1-x}C_yD_{1-y}$, or $AB_xC_yD_{1-x-y}$ (where A, B, C, and D are different elements). In general, alloys with more than four elements can be used as well, although it can be much harder to control the synthesis and quality of such materials. Embodiments of the invention pertain to solar cells having a layer incorporating two or more organic materials such that percolated paths for one or both molecular species are created. Specific embodiments of the invention pertain to a method for fabricating nanostructured bulk heterojunction that facilitates both efficient exciton diffusion and charge transport. Embodiments of the subject invention pertain to a solar cell having an architecture that allows for efficient harvesting of solar energy. The organic solar cell (Continued)

architecture can incorporate a host/guest (or matrix/dopant) material system that utilizes the long diffusion lengths for triplet excitons without compromising light absorption efficiency.

6 Claims, 1 Drawing Sheet

Related U.S. Application Data

(60) Provisional application No. 60/939,777, filed on May 23, 2007.

(52) U.S. Cl.
CPC .......... *H01L 51/426* (2013.01); *G03F 7/0002* (2013.01); *Y02E 10/549* (2013.01)

(58) Field of Classification Search
CPC ............... H01L 51/4266; H01L 51/424; H01L 51/4253; H01L 2031/0344
USPC .................................. 136/243–265
See application file for complete search history.

(56) References Cited

U.S. PATENT DOCUMENTS

| | | | |
|---|---|---|---|
| 6,294,398 B1 | 9/2001 | Kim et al. | |
| 6,849,798 B2 | 2/2005 | Mitra et al. | |
| 7,056,471 B1 | 6/2006 | Han et al. | |
| 2002/0148113 A1 | 10/2002 | Forrest et al. | |
| 2002/0172820 A1* | 11/2002 | Majumdar | B82Y 10/00 428/357 |
| 2003/0170959 A1 | 9/2003 | Salafsky | |
| 2003/0226498 A1* | 12/2003 | Alivisatos | B82Y 20/00 117/84 |
| 2004/0077156 A1 | 4/2004 | Tsakalakos et al. | |
| 2004/0084080 A1 | 5/2004 | Sager et al. | |
| 2004/0095658 A1* | 5/2004 | Buretea | B82Y 20/00 359/853 |
| 2004/0118448 A1* | 6/2004 | Scher | B82Y 10/00 136/252 |
| 2005/0045874 A1 | 3/2005 | Xiao et al. | |
| 2005/0061363 A1 | 3/2005 | Ginley et al. | |
| 2005/0061364 A1* | 3/2005 | Peumans | H01L 51/0026 136/263 |
| 2005/0098204 A1 | 5/2005 | Roscheisen et al. | |
| 2005/0126628 A1* | 6/2005 | Scher | B82Y 10/00 136/263 |
| 2005/0170621 A1 | 8/2005 | Kim et al. | |
| 2006/0060239 A1 | 3/2006 | Peumans et al. | |
| 2006/0127696 A1* | 6/2006 | Stossel | C07F 15/0033 428/690 |
| 2006/0160265 A1 | 7/2006 | Morii et al. | |
| 2006/0222592 A1* | 10/2006 | Burda | H01L 31/032 424/9.6 |
| 2006/0278944 A1 | 12/2006 | Rand et al. | |
| 2007/0012355 A1 | 1/2007 | LoCascio et al. | |
| 2007/0103068 A1 | 5/2007 | Bawendi et al. | |
| 2008/0023067 A1 | 1/2008 | Hu et al. | |

OTHER PUBLICATIONS

Hal, Paul A., et al., "Photoinduced singlet and triplet energy transfer in fullerene-oligothiophene-fullerence triads", Synthetic Metals, 2001, pp. 123-127, vol. 116.

Kim, Myung-Su, et al., "Flexible conjugated polymer photovoltaic cells with controlled heterojunctions fabricated using nanoimprint lithography", Applied Physics Letters, 2007, vol. 90, No. 123113.

Tang, C.W., et al., "Electroluminescence of doped organic thin films", Journal of Applied Physics, 1989, pp. 3610-3616, vol. 65.

Kim, Changsoon, et al., "Patterning of active organic materials by direct transfer for organic electronic devices", Journal of Applied Physics, 2005, vol. 97, No. 113512.

Kim, Changsoon, et al., "Fabrication of Organic Light-Emitting Devices by Low-Pressure Cold Welding", Advanced Materials, 2003, pp. 541-545, vol. 15, No. 6.

Liang, Ziqi, et al., "Direct Patterning of Poly(p-phenylene vinylene) Thin Films Using Microcontact Printing", Langmuir, 2003, pp. 5555-5558, vol. 19, No. 14.

\* cited by examiner

METHOD AND APPARATUS FOR LIGHT ABSORPTION AND CHARGED CARRIER TRANSPORT

CROSS-REFERENCE TO RELATED APPLICATIONS

The present application is a divisional of U.S. application Ser. No. 12/601,371, filed Nov. 23, 2009, which is the U.S. National Stage Application of International Patent Application No. PCT/US2008/064750, filed May 23, 2008, which claims the benefit of U.S. Provisional Application Ser. No. 60/939,777, filed May 23, 2007, all of which are hereby incorporated by reference herein in their entirety, including any figures, tables, or drawings.

STATEMENT OF GOVERNMENT SUPPORT

This invention was made with Government support under ECS064490 awarded by the National Science Foundation. The government has certain rights in the invention.

BACKGROUND

Inorganic nanocrystals have been used in hybrid organic-inorganic or all-inorganic solar cells [W. Huynh et al., Science, Vol. 295, pp. 2425-2427, 2002; I. Gur et al., Science, Vol. 310, pp. 462-465, 2005.] Power conversion efficiencies in the range of 2-3% have been demonstrated. In these devices, nanocrystals based on binary compound semiconductors are synthesized and processed in solution.

To efficiently absorb light in the broad solar spectrum (spanning from ultraviolet to visible to near infrared), the energy gap of the light absorber in the solar cells needs to be optimized. At the same time, the energy level alignment between different materials in the active region will have to be optimized as well to minimize the energy loss during charge generation and transport. This means that the band gap (the energy difference between the conduction and valence bands) and the electron affinity (the energy difference between the vacuum level and the conduction band) need to be independently optimized. Due to the quantum confinement effect, the band gap of a nanocrystal can be tuned to some extent by controlling the size of the nanocrystal during the synthesis process. The electron affinity will be varied accordingly. Therefore, it is unlikely that the use of binary compound semiconductors, which have fixed stoichiometry, will achieve the optimized band gap and the optimized electron affinity simultaneously.

Organic solar cells have the potential to provide very low cost solar energy conversion due to many technological advantages of organic semiconductors, such as low material cost, ease of processing, and compatibility with flexible substrates. There have been considerable interests in organic-based photovoltaic (OPV) cells in the last two decades, and the power conversion efficiency of OPV cells has steadily improved to the current record of approximately 5%. However, such efficiencies are still far lower than the theoretical limits, and it is imperative to greatly improve the efficiency to make this technology suitable for large-scale commercial applications.

In inorganic solar cells, the absorption of incident light leads to free positive and negative charge carriers in the semiconductor, which are then transported toward opposite electrodes under the influence of the built-in electric field. In organic semiconductors, because of the different fundamental properties from their inorganic counterparts, light absorption only leads to tightly bound charge pairs, called excitons, each having one positive charge (hole) and one negative charge (electron). A hetero-interface between two different organic semiconductors is generally used to split or dissociate the excitons and create free positive and negative charges, which are then transported toward opposite electrodes under the influence of built-in electric field, leading to a photocurrent and/or a photovoltage.

The excitons, which are neutral, if created away from the interface, may diffuse within the organic semiconductors through random hopping between neighboring molecules. However, typically the average distance these excitons can diffuse is only about 10 nm, nearly an order of magnitude shorter than the organic layer thickness (50 to 100 nm) needed for efficient absorption of the incident light.

One way to address the exciton-diffusion problem is to find materials that exhibit very long exciton diffusion lengths that are comparable with the necessary thickness (50 to 100 nm) for efficient absorption of incident light. While some organic materials can have slightly longer exciton diffusion lengths, it is generally difficult to find or synthesize such materials that are suitable for organic solar cells. One such example is fullerene ($C_{60}$), which has a reported exciton diffusion length of 40 nm. The current state-of-the-art organic solar cells typically use C60 or one of its soluble derivatives as one of the two materials in the photoactive region. C60, however, is not a very strong absorber for light with wavelength longer than 530 nm.

Mixing two or more organic semiconductor materials to form a so-called bulk heterojunction can circumvent the exciton-diffusion problem associated with organic semiconductors, as the interface between the different organic semiconductors in the bulk heterojunction is just one or a few molecules away from every exciton generation site. Such a bulk heterojunction can be formed by various processes, e.g., co-evaporation of two vacuum-sublimable molecules in a vacuum deposition system, spin coating or ink-jet printing of a blended solution of two different organic materials. However, the collection of photogenerated charge carriers depends on the charge transport properties of the bulk heterojunction, which in turn is strongly affected by the morphological structure of the material mixture. As the transport of charge carriers toward the respective electrodes relies on hopping between the same species of molecules, the random mixing of two different materials generally leads to inferior charge transport properties, i.e., lower charge carrier mobilities. Thus, a significant portion of the charges may not be able to reach the respective electrodes and be collected, partially negating the overall efficiency gain due to the improved exciton diffusion/charge generation process.

Based on the spins of the constituent positive and negative charges, an exciton can have a total spin of either 0 or 1, corresponding to the singlet and triplet state, respectively. Due to spin conservation, the transition between the ground state and the singlet exciton state is allowed, whereas it is forbidden between the ground state and triplet state. Therefore, compared with a singlet exciton, a triplet exciton has a much longer lifetime, as in the case of C60. This means that compared with a singlet exciton, a triplet exciton tends to diffuse farther before recombination, or before it "dies". Diffusion length as high as 150 nm for triplet excitons has been reported in 4,4'-bis(9-carbazolyl)-2,2'-biphenyl (CBP, a wide-gap material commonly used as the host for a luminescent dye in an OLED). However, triplet excitons have a much lower probability to be formed directly upon light absorption, again due to the disallowed transition from the ground state to the triplet exciton state. This means that the absorption corresponding to such triplet exciton states is generally much weaker than that to singlet excitons.

Accordingly, there is a need for an apparatus that can efficiently absorb light and allow the charged carriers created to diffuse to collection electrodes so as to be efficiently collected.

DETAILED DESCRIPTION

Figure 1:
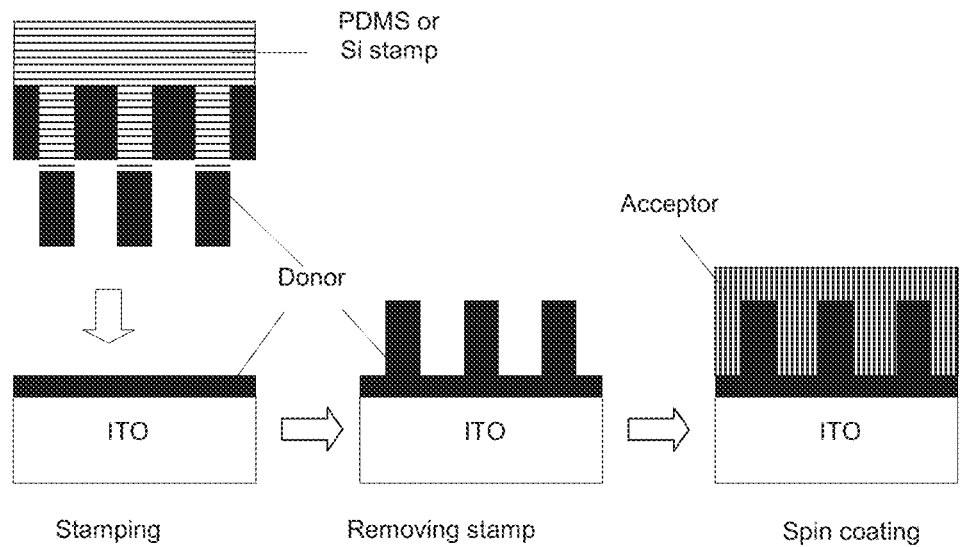
FIG. 1 shows an embodiment of a fabrication process of a nanostructured bulk heterojunction.

Embodiments of the invention pertain to the use of alloyed semiconductor nanocrystals for use in solar cells. The use of alloyed semiconductor nanocrystals offers materials that have a flexible stoichiometry. The alloyed semiconductor may be a ternary semiconductor alloy, such as $A_xB_{1-x}C$ or $AB_{1-y}C_y$, or a quaternary semiconductor alloy, such as $A_xB_yC_{1-x-y}D$, $A_xB_{1-x}C_yD_{1-y}$, or $AB_xC_yD_{1-x-y}$ (where A, B, C, and D are different elements). In general, alloys with more than four elements can be used as well, although it can be much harder to control the synthesis and quality of such materials. Ternary and quaternary semiconductor alloys can be formed from, but not limited to, II-VI, III-V, and I-VII compound semiconductors. Examples of such ternary alloys include, but are not limited to, $Zn_xCd_{1-x}Se$, $CdSe_yTe_{1-y}$, $Pb_xCd_{1-x}Se$, $In_xGa_{1-x}As$, and $InAs_{1-y}P_y$, where $0<x, y<1$. Quaternary semiconductor alloys can also be formed from I-III-VI$_2$ compound semiconductors. Examples of such quaternary alloys include, but are not limited to, $Cu(In_xGa_{1-x})Se_2$, $Cu(In_xGa_{1-x})S_2$, and $Cu(In_xAl_{1-x})Se_2$. Alloyed semiconductors also include group-IV semiconductor alloys including, but not limited to, $Si_xGe_{1-x}$.

The band gap and electron affinity of these alloyed semiconductors can be continuously varied by changing the alloy compositions. For ternary compound semiconductor alloys or group-IV semiconductor alloys, there is one composition variable (x in $A_xB_{1-x}C$ or $A_xB_{1-x}$, or y in $AB_{1-y}C_y$). For quaternary alloys, there are two independent composition variables (x and y in $A_xB_yC_{1-x-y}D$, $A_xB_{1-x}C_yD_{1-y}$, or $AB_xC_yD_{1-x-y}$). Hence, for nanocrystals based on ternary semiconductor alloys, there are two independent variables to tune their band gap and electron affinity. A first independent variable is the ternary alloy composition and the other independent variable is the nanocrystal size. Accordingly, adjusting the ternary alloy composition and the nanocrystal size allows simultaneous optimization of the band gap and electron affinity. For nanocrystals based on quaternary semiconductor alloys, the additional composition variable can provide even more freedom to optimize the band gap and electron affinity.

Embodiments of the subject invention relate to high efficiency nanocrystal based solar cells for providing low cost electricity generation from solar energy. The solar cells can incorporate ternary and/or quaternary compound semiconductor alloys or group-IV semiconductor alloys, where the alloy composition and the nanocrystal size are selected to achieve a desired band gap and electron affinity. Embodiments of the subject nanocrystal based solar cells have an optimized band gap of the light absorber(s) and an optimized energy level alignment between different materials in the photoactive region. The use of nanocrystals based on alloyed semiconductors can also allow independent tuning of the band gap and electron affinity by adjusting the composition of the semiconductor alloy in addition to the nanocrystal size.

Embodiments of the invention pertain to solar cells having a layer incorporating two or more organic materials such that percolated paths for one or both molecular species are created.

Specific embodiments of the invention pertain to a method for fabricating nanostructured bulk heterojunction that facilitates both efficient exciton diffusion and charge transport. Embodiments of the nanostructured bulk heterojunction provide a platform for easy integration of various materials. Embodiments can involve an interdigitated structure of two, or more, organic semiconductors with a voltage applied across the structure. The subject method involves using a stamping-transfer technique in conjunction with a solution process, such as spin coating or ink-jet printing, to fabricate an interdigitated donor-acceptor heterojunction with well controlled, vertically aligned, nanometer scale domains that can be made crystalline.

A specific embodiment of a fabrication process in accordance with the invention is illustrated in FIG. 1. Prior to the stamping process, a 40-200 nm thick donor layer is deposited on a pre-patterned stamp made from Si or polydimethylsiloxane (PDMS), which has nanoscale features 50 to 200 nm deep and 10 to 100 nm wide. A thin layer (~5 nm thick) of the donor material is also deposited onto the glass substrate coated with an indium-tin-oxide (ITO) anode. By minimizing the adhesion between the donor material and the stamp with an adhesion reduction layer or appropriate treatment on the stamp surface before donor material deposition, the donor on the stamp can be transferred to the substrate after the stamping process. The active region is completed by depositing the acceptor material using solution process, such as spin coating or ink-jet printing, to fill the space between the donor "fingers". The stamp can be re-used after washing away the residual organic materials in the grooves and re-depositing more donor material.

The stamping process has previously been shown to be capable of transferring metal or organic films between the stamp and the substrate relying on the bonding or interaction between the materials, C. Kim et al., Science, Vol. 288, pp. 831-833, 2000, C. Kim et al., Advanced Materials, Vol. 15, pp. 541-545, 2003; C. Kim et al., Journal of Applied Physics, Vol. 97, pp. 113512, 2005, which are hereby incorporated herein by reference in their entirety. The stamps with the desired nanostructure can be fabricated using several methods. In one method, a 10 to 20 nm thick Au layer can be evaporated onto a Si or PDMS substrate. Upon annealing the substrate, Au atoms will tend to coalesce and form islands with nanometer sizes, which can then be used as an etching mask to produce the nanostructured pattern on the stamp. Initial Au layer thickness, annealing temperature, and the substrate surface treatments can be used to control the size and spacing of the Au islands. Both wet and dry etching can be employed for Si substrates, while plasma dry etching can be used for PDMS. Alternatively, the etching mask can also be prepared using a block copolymer. As is well known in the art, by using a block copolymer such as polystyrene-poly(methyl methacrylate) (PS-PMMA), various ordered structures including cylindrical and lamella can be formed with nanometer scale morphologies. The PS-PMMA block copolymer film can be exposed to UV radiation followed by developing to remove the PMMA phase, leaving only the PS phase, which can be used as the etching mask to prepare the nanopatterned stamp.

Organic solar cells can utilize the interdigitated structures of two or more organic materials.

Embodiments of the nanostructured bulk heterojunction can be fabricated in a controlled fashion, and can provide pure domains of donor and acceptor organic semiconductor materials extending vertically throughout the active region. The successive processing for the donor and acceptor layers also makes it possible to prepare crystalline structures for both material species. With pure and crystalline material domains, the charge transport properties in the photoactive region can be optimized. In this way, efficient exciton diffusion and charge transport can be achieved simultaneously. The incorporation of the subject nanostructure bulk heterojunction structure in solar cells can improve the efficiency of such solar cells.

Embodiments of the subject nanostructure can utilize organic materials with relatively low mobilities, which have not been previously suitable for organic solar cells whereas the already low mobilities are even lower when the two or more organic materials are mixed. The subject nanostructure can also provide a platform for easy integration of different materials that requires different processing methods and/or conditions, e.g., vacuum deposited small molecular weight compounds (or small molecules), solution processable small molecules and polymers, and colloidal synthesized inorganic nanocrystals. The solution process described above that is used to deposit the acceptor can also ensure an overall smooth active layer to facilitate the large area device fabrication.

The material for the donor layer may be a phthalocyanine or a porphyrin, or a derivative of transition metal complex thereof, such as copper phthalocyanine (CuPc). The acceptor material may be comprised of, for example, a soluable derivative of fullerene, perylenes, naphthalenes, or nanotubules. Other suitable acceptor and donor material may be used.

Embodiments of the subject invention pertain to a solar cell having an architecture that allows for efficient harvesting of solar energy. The organic solar cell architecture can incorporate a host/guest (or matrix/dopant) material system that utilizes the long diffusion lengths for triplet excitons without compromising light absorption efficiency. The concept of host/guest system has been effectively used to greatly enhance the luminescence efficiencies of organic light-emitting devices (OLEDs) [C. W. Tang et al., Journal of Applied Physics, Vol. 65, pp. 3610-3616, 1989]. In an embodiment of an organic solar cell structure, the absorption and exciton transport are separated, where the guest molecules (or the dopant) function as light absorber, and the host molecules (or the matrix) function as the medium to transport excitons. Separating the two functions can allow for the individual tailoring of different properties, thus offering great flexibility in material selection and device optimization.

Figure 2:
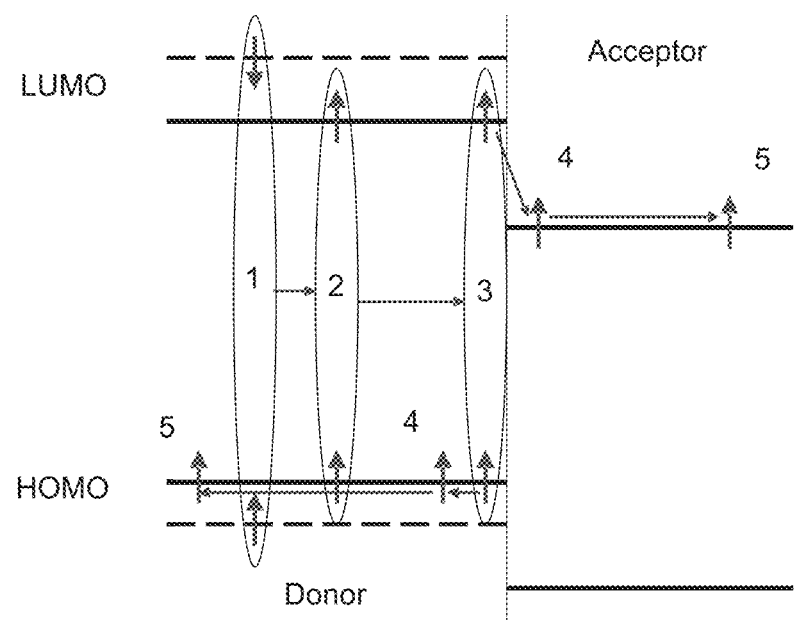
FIG. 2 shows a schematic energy level diagram of a sensitized organic photovoltaic cell, where HOMO and LUMO are the highest occupied and lowest unoccupied molecular orbitals, respectively, and the dashed lines in the donor layer are for the energy levels of a guest molecule, the singlet exciton "sensitizer", and the solid lines are for the host molecule, the triplet exciton "transporter".

As illustrated in the FIG. 2, in a specific embodiment, the absorption of an incident photon occurs on a guest (or "sensitizer") molecule where a singlet exciton 1 is created. Through an energy transfer process, the guest molecule returns to the ground state by emitting a "virtual" photon, which is absorbed by a nearby host molecule, leading to a triplet excited state 2. This process can be very efficient and can occur between host and guest molecules up to 100 Å apart. Subsequently, the triplet exciton can be efficiently transported towards the donor-acceptor heterojunction (DA HJ) 3 among the host molecules (i.e., the "transporter") due to their very long diffusion length. The host molecules can also be the medium for charge transport once charges are generated at the DA HJ 4 and 5. Note that this sensitizer-transporter system can be used in both the donor and acceptor side of a HJ, although only the application in the donor layer is illustrated in FIG. 2.

The much longer triplet exciton diffusion length can allow the use of ~10 times thicker layer for the sensitizer-transporter mixture compared with a pure layer of the singlet sensitizer material. Assuming the mixture can contain up to 40% of the sensitizer molecules to maintain a well percolated transporter molecular network, up to 5 times higher optical density can be achieved using this architecture.

Singlet-exciton organic materials typically have very short exciton diffusion lengths, which lead to rather incomplete absorption of the incident light within the photoactive region. Triplet-exciton materials do possess much longer exciton diffusion length, but suffer from very weak light absorption properties. Accordingly, embodiments of the singlet-sensitizer/triplet-transporter architecture can combine the advantages of both types of materials, thus leading to significant improvement of the overall energy conversion efficiency.

While FIG. 2 illustrates the use of this singlet-sensitizer/triplet-transporter architecture in the donor layer, a similar structure can be used for the acceptor layer, or in both the donor and acceptor layer. Organic materials suitable for use as the singlet exciton absorber in a donor layer may include, but are not limited to, a phthalocyanine or a porphyrin, or derivative of transition metal complex thereof. The singlet exciton absorber in the acceptor layer may include, for example, a perylene or a naphthalene. Triplet exciton materials include, but are not limited to, fullerenes and organometallic compounds with heavy metal atoms such as Ir or Pt.

All patents, patent applications, provisional applications, and publications referred to or cited herein are incorporated by reference in their entirety, including all figures and tables, to the extent they are not inconsistent with the explicit teachings of this specification.

It should be understood that the examples and embodiments described herein are for illustrative purposes only and that various modifications or changes in light thereof will be suggested to persons skilled in the art and are to be included within the spirit and purview of this application.

What is claimed is:

1. A solar cell device, comprising:
a donor region having a donor layer made of a crystalline donor material, wherein the donor layer has a plurality of vertically aligned protrusions extending therefrom in a controlled pattern, where each protrusion has a height of about 50 nm to 200 nm and a width of about 10 nm to 100 nm, where the distance between a pair of protrusions is about 10 nm to 100 nm, wherein the crystalline donor material is a first organic material, wherein the donor region is disposed on a indium-tin-oxide anode, wherein the donor region comprises the crystalline donor material and a dopant material, wherein the donor region has the following characteristics: the dopant material has the characteristic of being able to absorb an incident photon to create a singlet exciton, a virtual photon is emitted by the dopant material that absorbed the incident photon and a host material has the characteristic of being able to absorb the virtual photon to create a triplet exciton, and the donor region has the characteristic that the triplet exciton is transported within the donor region; and an acceptor region having an acceptor layer made of a crystalline acceptor material, wherein the acceptor layer is disposed among the plurality of protrusions of the donor layer and on top of the plurality of protrusions of the donor layer to cover the donor region, wherein the crystalline acceptor material is a second organic material, wherein the first organic material and the second organic material are different, wherein the acceptor region contacts the donor region to form a nano-structured donor-acceptor heterojunction, wherein the nano-structured donor-acceptor heterojunction, donor region, and the acceptor region have the following characteristics: the triplet exciton is transported within the donor region to the nano-structured donor-acceptor heterojunction, the triplet exciton creates a first charge and a second charge at the nano-structured donor-acceptor heterojunction, the first charge is transported away from the nano-structured donor-acceptor heterojunction in the acceptor region, and the second charge is transported away from the nano-structured donor-acceptor heterojunction in the donor region.

2. The solar cell device according to claim 1, wherein the crystalline donor material is a phthalocyanine, a porphyrin, a derivative of a transition metal complex of a phthalocyanine, or a transition metal complex of a porphyrin.

3. The solar cell device according to claim 1, wherein the crystalline acceptor material is a soluble derivative of a fullerene, a perylene, a naphthalene, or a nanotubule.

4. The solar cell device according to claim 1, wherein the first organic material is a first organic semiconductor and the second organic material is a second organic semiconductor.

5. The solar cell device according to claim 1, wherein the acceptor layer comprises up to 40% dopant material, and wherein the optical density of the acceptor region is up to 5 times higher than the optical density of a pure layer of crystalline dopant material.

6. A solar cell device, comprising:
an acceptor region having an acceptor layer made of a crystalline acceptor material, wherein the acceptor layer has a plurality of vertically aligned protrusions extending therefrom in a controlled pattern, where each protrusion has a height of about 50 nm to 200 nm and a width of about 10 nm to 100 nm, where the distance between a pair of protrusions is about 10 nm to 100 nm, wherein the crystalline acceptor material is a first organic material, wherein the acceptor region is disposed on a indium-tin-oxide anode, wherein the acceptor region comprises crystalline acceptor material and a dopant material, wherein the acceptor region has the following characteristics: the dopant material has the characteristic of being able to absorb an incident photon to create a singlet exciton, a virtual photon is emitted by the crystalline acceptor material that absorbed the incident photon and a host material has the characteristic of being able to absorb the virtual photon to create a triplet exciton, and the acceptor region has the characteristic that the triplet exciton is transported within the acceptor region; and a donor region having a donor layer made of a crystalline donor material, wherein the donor layer is disposed among the plurality of protrusions of the acceptor layer and on top of the plurality of protrusions of the acceptor layer to cover the acceptor region, wherein the crystalline donor material is a second organic material, wherein the first organic material and the second organic material are different, wherein the donor region contacts the acceptor region to form a nano-structured donor-acceptor heterojunction, wherein the nano-structured donor-acceptor heterojunction, donor region, and the acceptor region have the following characteristics: the triplet exciton is transported within the acceptor region to the nano-structured donor-acceptor heterojunction, the triplet exciton creates a first charge and a second charge at the nano-structured donor-acceptor heterojunction, the first charge is transported away from the nano-structured donor-acceptor heterojunction in the donor region, and the second charge is transported away from the nano-structured donor-acceptor heterojunction in the acceptor region.

* * * * *